United States Patent
Kranz

(10) Patent No.: US 6,885,254 B2
(45) Date of Patent: Apr. 26, 2005

(54) CALIBRATION DEVICE AND METHOD FOR GENERATING A CLOCK IN AN INTEGRATED CIRCUIT

(75) Inventor: Christian Kranz, Ratingen Lintorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/320,125

(22) Filed: Dec. 16, 2002

(65) Prior Publication Data

US 2003/0095008 A1 May 22, 2003

Related U.S. Application Data

(63) Continuation of application No. PCT/DE01/01911, filed on May 17, 2001.

(30) Foreign Application Priority Data

Jun. 15, 2000 (DE) .......................................... 100 29 421

(51) Int. Cl.[7] .............................................. H03B 1/00
(52) U.S. Cl. .......................... 331/74; 331/1 A; 331/18; 331/175; 455/196.1
(58) Field of Search ................................ 331/1 A, 175, 331/18, 74, 25, 57; 327/156, 159; 455/196.1, 208, 214, 216

(56) References Cited

U.S. PATENT DOCUMENTS

| 4,658,406 A | | 4/1987 | Pappas .......................... 377/48 |
| 5,789,969 A | * | 8/1998 | Davis et al. ................. 327/276 |

FOREIGN PATENT DOCUMENTS

| DE | 38 31 903 A1 | 3/1990 |
| DE | 694 16 586 T2 | 3/1996 |
| DE | 696 00 658 T2 | 9/1998 |
| DE | 198 38 096 A1 | 6/1999 |
| EP | 0 700 600 B1 | 3/1996 |
| EP | 0 757 433 B1 | 2/1997 |
| EP | 0 851 593 A2 | 7/1998 |
| EP | 0 939 495 A1 | 9/1999 |
| JP | 04 170 823 | 6/1992 |
| WO | WO 98/20620 | 5/1998 |

* cited by examiner

*Primary Examiner*—Arnold Kinkead
(74) *Attorney, Agent, or Firm*—Laurence A. Greenberg; Werner H. Stemer; Gregory L. Mayback

(57) ABSTRACT

To generate an accurate frequency standard in an integrated circuit, it is proposed to activate a reference oscillator at certain time intervals and to calibrate the local oscillator. For this purpose, a calibration circuit is provided, which determines the clock ratio between the internal clock and the reference clock. The clock ratio determined is used for programming a frequency divider. The calibration circuit is particularly suitable for being used in mobile radio devices.

18 Claims, 2 Drawing Sheets

CALIBRATION DEVICE AND METHOD FOR GENERATING A CLOCK IN AN INTEGRATED CIRCUIT

CROSS-REFERENCE TO RELATED APPLICATION

This application is a continuation of copending International Application No. PCT/DE01/01911, filed May 17, 2001, which designated the United States and was not published in English.

BACKGROUND OF THE INVENTION

Field of the Invention

The invention relates to a calibration device and a calibration method for an oscillator located in an integrated circuit. In particular, the invention relates to a frequency standard for applications in the radio field, which can be implemented with the aid of the calibration device according to the invention.

Many applications require a frequency standard that operates with high accuracy in a switched-off state or in a standby state. Such a frequency standard can be used, for example in devices with a radio interface, to maintain the synchronization between two devices in the standby mode. Devices with a radio interface typically have a high-frequency crystal oscillator (for example with a frequency of 13 MHz). However, the crystal oscillator is only active in the switched-on state; in the standby state, the high-frequency crystal oscillator is switched off.

To be able to maintain the operation of the frequency standard even in the switched-off state or in the standby state, there is in known solutions provided a second crystal oscillator that is permanently active. For the crystal oscillator, a watch crystal having a natural frequency of 32 kHz or 32.768 kHz is typically used. Watch crystals are distinguished by low power consumption and are therefore particularly suitable for use in the standby state. The disadvantageous factor in such a solution is that two crystal oscillators must be provided.

SUMMARY OF THE INVENTION

It is accordingly an object of the invention to provide a calibration device and a method for generating a clock in an integrated circuit that overcome the above-mentioned disadvantages of the prior art devices and methods of this general type, which can be constructed in an inexpensive and space-saving manner.

With the foregoing and other objects in view there is provided, in accordance with the invention, a calibration device for generating a clock in an integrated circuit. The calibration device contains a device for generating clock signals disposed in the integrated circuit. The device generates both an internal clock and a target clock. A reference oscillator is provided and has selectably an active state and a passive state, the reference oscillator supplying a reference clock in the active state. A calibration circuit is connected to the device and the reference oscillator and receives the internal clock and the reference clock. The calibration circuit determines a clock ratio between the internal clock and the reference clock. The device for generating clock signals has means for influencing the target clock in dependence on the clock ratio determined by the calibration circuit. The means for influencing the target clock is coupled to the calibration circuit.

In the calibration device according to the invention, only one reference oscillator is provided which is activated from time to time. The reference oscillator is the abovementioned high-frequency crystal oscillator. The reference oscillator is used for calibrating the device for clock generation located in the integrated circuit that permanently generates both an internal clock and the required target clock. The device for clock generation represent the actual frequency standard, the required accuracy being ensured by repeated calibration with the reference oscillator.

The calibration itself is performed with the aid of a calibration circuit which is supplied both with the internal clock generated by the frequency standard and with the reference clock of the crystal oscillator. The calibration circuit determines the clock ratio between the internal clock and the reference clock and influences the target clock in dependence on the clock ratio found in order thus to ensure the required frequency accuracy of the target clock.

The advantage of this solution is that the second, permanently active watch crystal oscillator can be omitted without being replaced. This reduces the number of components required, which is why the frequency standard according to the invention can be constructed inexpensively. On the other hand, less space is required, which is of significance particularly for applications in the mobile radio field, for example in the case of GSM mobiles.

According to an advantageous embodiment of the invention, the device for generating a clock contains a local oscillator which is located in the integrated circuit and which generates both the internal clock and the target clock, the internal clock being identical with the target clock. In this simple embodiment of the invention which is inexpensive to implement, the internal clock is not subjected to frequency division but is used directly as the target clock.

According to another advantageous embodiment of the invention, the device for generating a clock contains a local oscillator that is located in the integrated circuit and generates the internal clock, and a frequency divider which is also located in the integrated circuit and converts the internal clock into the target clock. In this embodiment of the invention, the local oscillator generates a high-frequency internal clock that is then converted into the low-frequency target clock by a frequency divider. This solution allows the desired target clock to be generated with high accuracy.

The means for influencing the target clock can be implemented by using a programmable frequency divider. Such a programmable frequency divider allows the target clock to be adjusted in dependence on the clock ratio determined by the calibration circuit. During reprogramming of the programmable frequency divider, the target frequency is changed accurately and immediately. Due to the fact that the frequency division is provided digitally, the target frequency output can be adjusted very accurately. In this embodiment of the invention, the oscillator is not influenced, as a result of which transient processes can be avoided.

It is advantageous if a digital fractional divider is used as the programmable divider. Such a fractional divider can be used for performing a frequency division that is accurate to within fractions, and the target frequency output can, therefore, be set very accurately by such a divider.

The means for influencing the target clock can also be implemented by using a tunable local oscillator. The internal clock generated can be influenced by varying resistors and/or capacitors and/or control voltages or control currents. Since the target clock is either identical with the internal clock or is a product of the latter by frequency division, the target clock generated can also be influenced by this means. This allows the target clock to be adjusted in dependence on the clock ratio determined by the calibration circuit.

The analog embodiment, which can be produced with little constructional expenditure, provides for continuous variation of the target clock generated and represents an inexpensive alternative to the use of digital frequency dividers.

It is advantageous if the reference oscillator changes from the passive state into the active state and conversely from the active state back into the passive state at periodic intervals. Thus, the local oscillator is calibrated at regular intervals and the deviations of the target clock generated from the desired target clock vary within narrow tolerance limits.

According to another embodiment of the invention, an external timer is provided which controls the transition of the reference oscillator from the passive state into the active state and conversely from the active state back into the passive state. This represents the simplest possibility of activating the reference oscillator at regular intervals and initiating a calibration of the local oscillator. The external timer can also handle other control processes so that the additional constructional expenditure becomes relative.

It is of advantage to use the generated target clock itself for controlling the transition of the reference oscillator from the passive state into the active state and conversely from the active state back into the passive state. If the generated target clock is used for controlling the calibration cycle, it is only necessary to use a simple additional counter chip instead of a complete timer circuit. Thus, using the target clock for controlling the calibration cycle allows a simple and cost-saving solution with little expenditure on components.

It is advantageous if the transition of the reference oscillator from the passive state into the active state and conversely from the active state back into the passive state is synchronized with the switching-on and switching-off of the complete system. In many applications in the radio field it is necessary to switch the radio device on at regular intervals and to establish the connection with the base station. For example, this applies to the connection between a base station and a mobile radio according to the GSM standard. It is advantageous to couple the calibration process with the switching-on of the complete system in such systems.

According to another advantageous embodiment of the invention, the reference clock, instead of the internal clock, is used for generating the target clock during the periods in which the reference oscillator is in its active state. During the calibration, the target clock is thus derived from the robust, accurate-frequency crystal oscillator. This is advantageous particularly if disturbances of the local oscillator must be expected during the calibration process.

It is advantageous, particularly when the calibration process is synchronized with the switching-on and switching-off of the complete system, to derive the target clock from the reference oscillator during the calibration process since the reference oscillator is disturbed to a lesser degree than the local oscillator by switching-on and switching-off processes.

For example, the switching-on of the power amplifier for the transmit mode in GSM mobiles leads to disturbances of the local oscillator because the supply voltage drops and, there is radio-frequency interference.

According to a further advantageous embodiment of the invention, the transition of the reference oscillator from the passive state into the active state is initiated by an external interference signal. Independently of the calibration process, the target clock is derived from the reference oscillator in the presence of a disturbance. Although the disturbance influences the local oscillator, a stable frequency standard remains guaranteed.

It is recommended to provide a crystal oscillator as the reference oscillator because of the high frequency accuracy and stability of oscillating crystals.

It is advantageous to determine the clock ratio between the internal clock and the reference clock repeatedly by the calibration circuit until the result remains essentially unchanged. If the local oscillator generates an irregular internal clock, for example because of temperature drift or because of fluctuations in the supply voltage, measurements are continued until a state of equilibrium is reached.

The invention is particularly suitable for being used in devices for transmitting and receiving data. It is important, particularly in mobile radio devices such as, for example, mobiles, that the device can manage with a small number of components and can be constructed to be small.

In particular, the calibration method according to the invention for generating a clock in an integrated circuit provides the advantage that the reference oscillator does not need to be permanently in its active state but is only switched from the passive state into the active state for performing the calibration. This renders superfluous the use of a permanently active watch crystal.

Other features which are considered as characteristic for the invention are set forth in the appended claims.

Although the invention is illustrated and described herein as embodied in a calibration device and a method for generating a clock in an integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
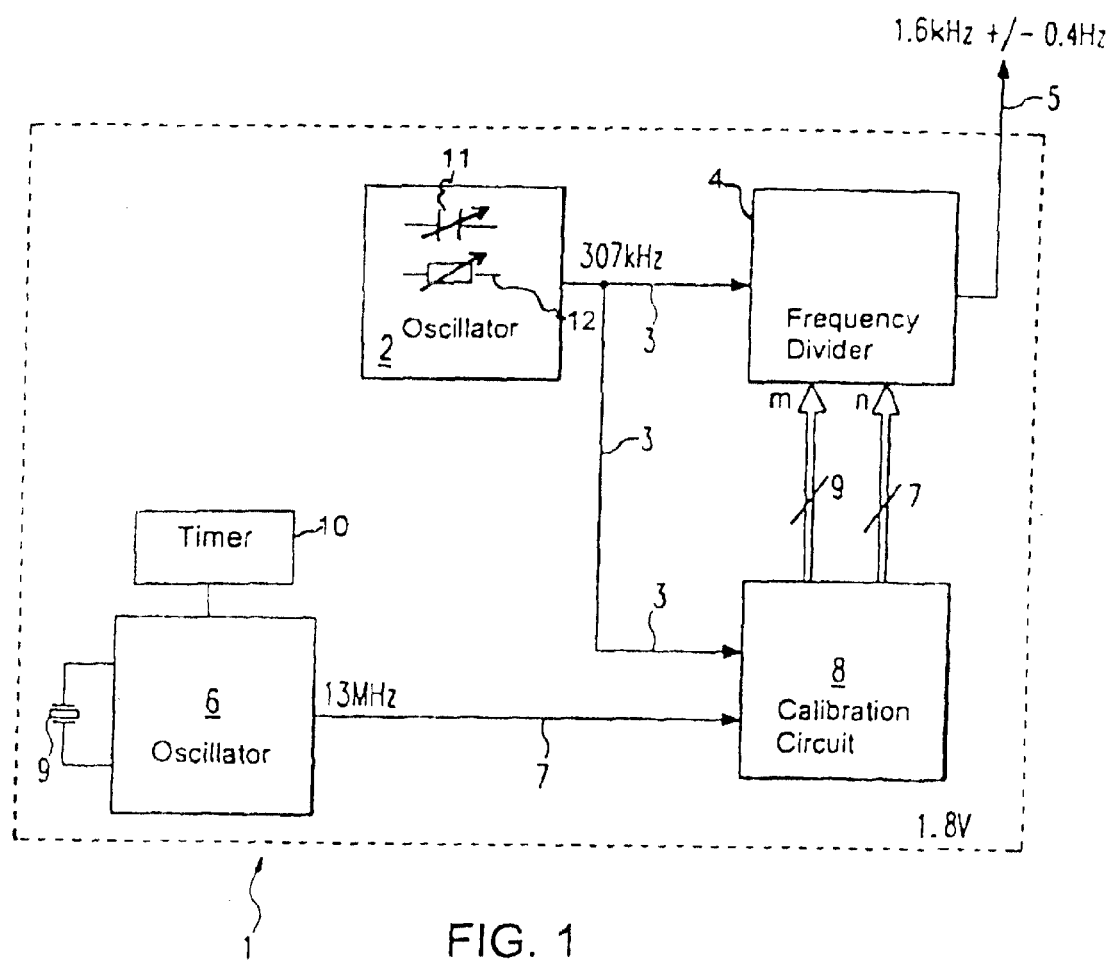
FIG. 1 is a block diagram of a calibration device according to the invention.

Referring now to the figures of the drawing in detail and first, particularly, to FIG. 1 thereof, there is shown a calibration device 1 according to the invention, by which an accurate frequency standard 5 can be implemented, for example for use in mobile radio devices. A local oscillator 2, which also remains active in a standby mode, is provided in an integrated circuit. The local oscillator 2 generates an internal clock 3 of 307.2 kHz that is supplied to a digital programmable frequency divider 4.

The frequency divider 4 is also located in the integrated circuit and remains active in the standby mode. The frequency divider 4 converts the internal clock 3 into the target clock 5 in accordance with a dividing ratio predetermined by the parameters m and n. m specifies an integral proportion and n specifies a fractional proportion, referred to the denominator 128, so that the following holds true:

$$\text{dividing ratio} = m + \frac{n}{128}$$

In the example shown in FIG. 1, the internal clock is 307.2 kHz and the target clock used as the frequency standard is 1.6 kHz. The required dividing ratio is obtained by dividing both frequencies with respect to 192 and, therefore, m=192 and n=0.

The target clock can be influenced by using a tunable local oscillator. The internal clock generated can be influenced by varying resistors 12 and/or capacitors 11 and/or control voltages or control currents. Since the target clock is either identical with the internal clock or is a product of the latter by frequency division, the target clock generated can also be influenced by this process.

Since the internal clock 3 generated by the local oscillator 2 does not have the required long-term stability, the local oscillator 2 must be recalibrated at certain intervals. This is done by reestablishing the parameters m and n of the programmable frequency divider 4. To perform the calibration, a reference oscillator 6 is switched on and generates a reference clock 7, which is 13 MHz in the example shown, by an oscillator crystal 9.

Both the internal clock 3 and the reference clock 7 are supplied to a calibration circuit 8 that determines the clock ratio between the internal clock and the reference clock. For this purpose, the number of clock pulses of the reference oscillator 6 is counted within a particular period of time that is determined by 1024 clock pulses of the slower local oscillator 2. The slower the oscillation of the local oscillator 2, the longer the measuring period and the more clock pulses of the reference oscillator 6 are counted. For example, a frequency of 307.2 kHz of the local oscillator results in a measuring period of 3.33 milliseconds, and in this period 43,333.3 clock pulses of the reference oscillator 6 are counted.

The number of 13-MHz clock pulses found is indirectly proportional to the dividing ratio. The program listed below shows how the parameters m and n for the programmable frequency divider 4 can be obtained from a number fcnt of 13-MHz clock pulses. The number 8,320,000 is obtained from $$\frac{13\ \text{MHz} \times 1024}{1.6\ \text{kHz}}$$

```
fcnt = (long) (13E6/fosc * 1024);
/* calculation of the parameters m, n for the */
/* programmable frequency divider */
/* fcnt is the number of 13 MHz clock pulses, */
/* which are counted within 1024 clock pulses of the */
/* local oscillator */
m = (long) 8320000%fcnt; /* integral proportion
    /* of the division */
n = (long) 8320000%fcnt; /* remainder of the division */
n = (n*128)/fcnt; /* only the first 7 bits */
if (n > 63) /* 7-bit 2s complement */
{
  n = -(128-n);
  m++;
}
```

An external timer 10 is provided which controls the transition of the reference oscillator from the passive state into the active state and conversely from the active state back into the passive state. This represents the simplest possibility of activating the reference oscillator at regular intervals and initiating a calibration of the local oscillator. The external timer 10 can also handle other control processes so that the additional constructional expenditure becomes relative.

Figure 2:
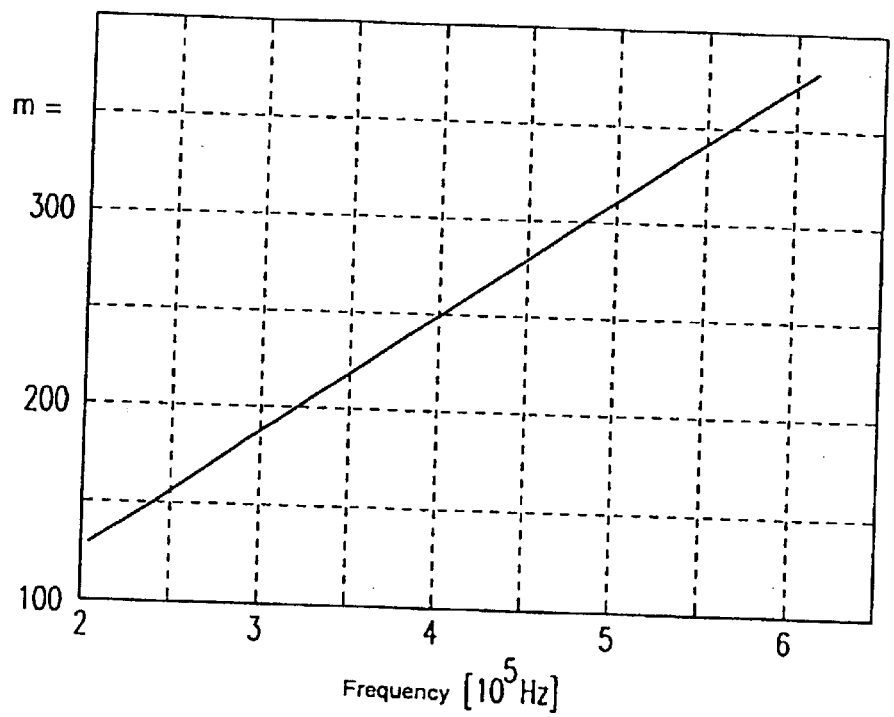
FIG. 2 is a graph showing an integral proportion m of a dividing ratio of a programmable frequency divider as a function of an internal frequency.

In FIG. 2, an integral proportion m of the dividing ratio is plotted as a function of the frequency generated by the local oscillator 2. A linear relationship is obtained: the higher the internal frequency, the greater m must be selected in order to reach the required target clock 5.

Figure 3:
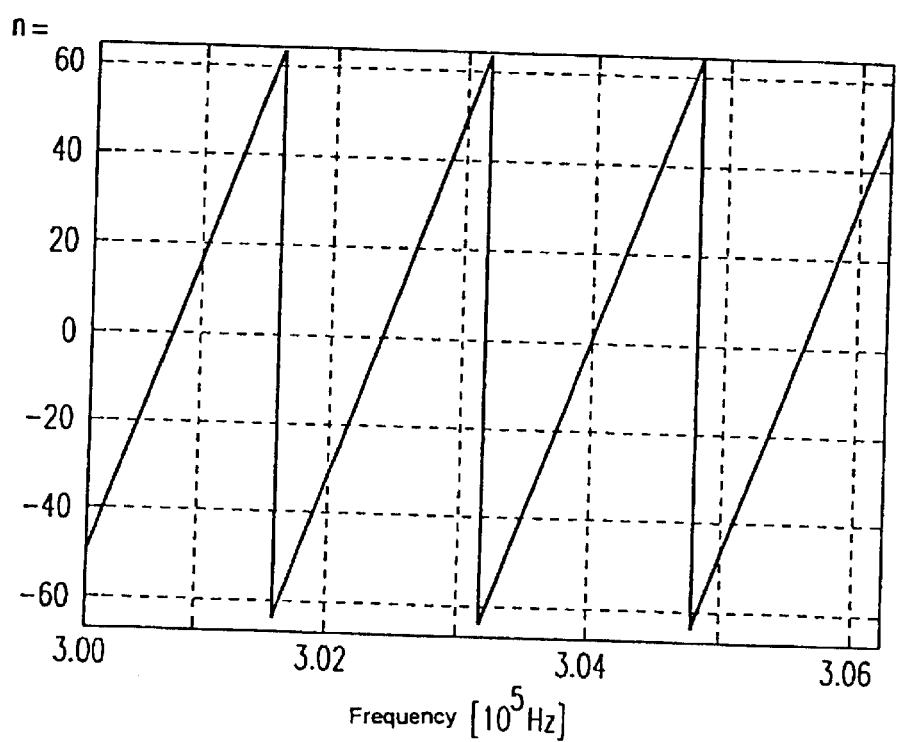
FIG. 3 is a graph showing a fractional proportion n of the dividing ratio of the programmable frequency divider as a function of the internal frequency.

FIG. 3 shows a fractional proportion n of the dividing ratio as a function of the frequency (plotted here on an enlarged scale) of the local oscillator 2. In each case, a sawtooth-like increase of n with increasing frequency can be seen, n assuming values from −64 to +63. Whenever the associated integral proportion m of the dividing ratio is incremented by 1, the fractional proportion n changes from n=63 to n=−64.

The fractional proportion n of the dividing ratio allows the dividing ratio to be adjusted precisely. Thus, the target clock 5 can be kept constant with an accuracy of 250 ppm that corresponds to a frequency error of less than 0.4 Hz at a frequency of 1.6 kHz.

In the text following, a possibility will be discussed for how the fractional proportion n can be taken into consideration in the frequency division. The example m=162, n=27 will be used as a basis. Therefore, the internal clock 3 is to be subjected to a frequency division by $$162\frac{27}{128}$$

The fractional proportion is taken into consideration in that in each fourth $$\left(\frac{128}{27} \approx 4\right)$$

lock period of the target clock, the internal clock frequency is divided not only by the factor 162 but by the factor 163 which is increased by 1, in order to obtain the frequency of the target clock. In this manner, the fractional proportion n of the dividing ratio can be taken into consideration uniformly distributed over 128 dividing cycles.

This is illustrated in the table below. In the bottom row, the respective dividing cycle is specified, and in the top row, the associated dividing ratio is specified. Every fourth clock pulse, the integral proportion m is modified. m is modified the last time after 108 dividing cycles.

| 162 | 162 | 162 | 163 | 162 | 162 | 162 | 163 | ... | 163 | 162 | 162 | 162 | 162 | 162 | ... | 162 |
|---|---|---|---|---|---|---|---|---|---|---|---|---|---|---|---|---|
| 1 | 2 | 3 | 4 | 5 | 6 | 7 | 8 | ... | 108 | 109 | 110 | 111 | 112 | 113 | ... | 128 |

In principle, if n>63, the integral proportion m of the dividing ratio would be incremented by 1 but this would be omitted every $$\frac{128}{128-n}$$

dividing cycles.

I claim:

1. A calibration device for generating a clock in an integrated circuit, comprising:
    a device for generating clock signals disposed in the integrated circuit, said device generating both an internal clock and a target clock, said device for generating clock signals containing a local oscillator disposed in the integrated circuit, said local oscillator generating both the internal clock and the target clock, the internal clock being identical to the target clock;
    a reference oscillator having selectably an active state and a passive state, said reference oscillator supplying a reference clock in the active state; and
    a calibration circuit connected to said device and said reference oscillator and receiving the internal clock and the reference clock, said calibration circuit determining a clock ratio between the internal clock and the reference clock;
    said device for generating clock signals having means for influencing the target clock in dependence on the clock ratio determined by said calibration circuit, said means for influencing the target clock coupled to said calibration circuit.

2. A calibration device for generating a clock in an integrated circuit, comprising:
    a device for generating clock signals disposed in the integrated circuit, said device generating both an internal clock and a target clock said device for generating the clock signals containing:
        a local oscillator disposed in the integrated circuit and generating the internal clock; and
        a frequency divider disposed in the integrated circuit and connected to said local oscillator, said frequency divider converting the internal clock into the target clock;
    a reference oscillator having selectably an active state and a passive state, said reference oscillator supplying a reference clock in the active state; and
    a calibration circuit connected to said device and said reference oscillator and receiving the internal clock and the reference clock, said calibration circuit determining a clock ratio between the internal clock and the reference clock;
    said device for generating clock signals having means for influencing the target clock in dependence on the clock ratio determined by said calibration circuit, said means for influencing the target clock coupled to said calibration circuit.

3. The calibration device according to claim 2, wherein said means for influencing the target clock is implemented at least partially by said frequency divider being a programmable frequency divider, the target clock output being adjustable in dependence on the clock ratio determined by said calibration circuit.

4. The calibration device according to claim 3, wherein said programmable frequency divider is a digital fractional divider.

5. The calibration device according to claim 1, wherein said means for influencing the target clock is implemented at least partially in that said local oscillator is a tunable local oscillator, the target clock being adjustable by varying at least one of resistors, capacitors, control voltages, and control currents in dependence on the clock ratio determined by said calibration circuit.

6. The calibration device according to claim 2, wherein said reference oscillator changes from the passive state into the active state and conversely from the active state back into the passive state at periodic intervals.

7. The calibration device according to claim 6, further comprising an external timer for controlling a transition of said reference oscillator from the passive state into the active state and conversely from the active state back into the passive state.

8. The calibration device according to claim 6, wherein the target clock is used for controlling a transition of said reference oscillator from the passive state into the active state and conversely from the active state back into the passive state.

9. The calibration device according to claim 2, wherein a transition of said reference oscillator from the passive state into the active state and conversely from the active state back into the passive state is synchronized with the switching-on and switching-off of a complete system.

10. A calibration device for generating a clock in an integrated circuit, comprising:
    a device for generating clock signals disposed in the integrated circuit, said device generating both an internal clock and a target clock;
    a reference oscillator having selectably an active state and a passive state, said reference oscillator supplying a reference clock in the active state, during periods in which said reference oscillator is in the active state, the reference clock is used instead of the internal clock for generating the target clock; and
    a calibration circuit connected to said device and said reference oscillator and receiving the internal clock and the reference clock, said calibration circuit determining a clock ratio between the internal clock and the reference clock;
    said device for generating clock signals having means for influencing the target clock in dependence on the clock ratio determined by said calibration circuit, said means for influencing the target clock coupled to said calibration circuit.

11. The calibration device according to claim 10, wherein a transition of said reference oscillator from the passive state into the active state is initiated by an external interference signal.

12. The calibration device according to claim 11, wherein said reference oscillator is a crystal oscillator.

13. The calibration device according to claim 2, wherein said calibration circuit repeatedly determines the clock ratio between the internal clock and the reference clock until a result remains essentially unchanged.

14. A device for transmitting and receiving data, comprising:

a calibration device, containing:
a device for generating clock signals disposed in the integrated circuit, said device generating both an internal clock and a target clock;
a reference oscillator having selectably an active state and a passive state, said reference oscillator supplying a reference clock in the active state; and
a calibration circuit connected to said device and said reference oscillator and receiving the internal clock and the reference clock, said calibration circuit determining a clock ratio between the internal clock and the reference clock;
said device for generating clock signals having means for influencing the target clock in dependence on the clock ratio determined by said calibration circuit, said means for influencing the target clock coupled to said calibration circuit.

15. A calibration method for generating a clock in an integrated circuit, the integrated circuit containing a device for generating clock signals including an internal clock and a target clock, which method comprises the steps of:

providing the device for generating clock signals with a local oscillator disposed in the integrated circuit, the local oscillator generating both the internal clock and the target clock, the internal clock being identical to the target clock;
changing a reference oscillator from a passive state into an active state, the reference oscillator supplying a reference clock to the integrated circuit in the active state;
determining a clock ratio between the internal clock and the reference clock; and
influencing the target clock in dependence on the clock ratio between the internal clock and the reference clock.

16. A calibration method for generating a clock in an integrated circuit, the integrated circuit containing a device for generating clock signals including an internal clock and a target clock, which method comprises the steps of:

providing the device for generating clock signals with a local oscillator disposed in the integrated circuit and generating the internal clock, and with a frequency divider disposed in the integrated circuit and converting the internal clock into the target clock;
changing a reference oscillator from a passive state into an active state, the reference oscillator supplying a reference clock to the integrated circuit in the active state;
determining a clock ratio between the internal clock and the reference clock; and
influencing the target clock in dependence on the clock ratio between the internal clock and the reference clock.

17. The calibration method according to claim 16, which comprises forming the frequency divider as a programmable frequency divider and in that the target clock is influenced by programming the frequency divider.

18. The calibration method according to claim 15, which comprises forming the local oscillator as a tunable oscillator and in that the target clock is influenced by varying at least one of resistors, capacitors, control voltages, and control currents.

* * * * *